United States Patent
Yang et al.

(10) Patent No.: US 9,013,390 B2
(45) Date of Patent: Apr. 21, 2015

(54) GATE DRIVER WITH NODE STABILIZER AND DISPLAY DEVICE INCLUDING THE SAME

(75) Inventors: Jin-Wook Yang, Yongin (KR); Sang-Jae Yeo, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 560 days.

(21) Appl. No.: 13/292,342

(22) Filed: Nov. 9, 2011

(65) Prior Publication Data

US 2013/0027377 A1    Jan. 31, 2013

(30) Foreign Application Priority Data

Jul. 29, 2011  (KR) .......................... 10-2011-0075555

(51) Int. Cl.
- G09G 3/36    (2006.01)
- G11C 19/18   (2006.01)
- G11C 19/28   (2006.01)

(52) U.S. Cl.
CPC ............ *G11C 19/184* (2013.01); *G09G 3/3677* (2013.01); *G11C 19/28* (2013.01); *G09G 2310/0286* (2013.01)

(58) Field of Classification Search
CPC .. G09G 3/3688; G09G 3/3677; G09G 3/3648
USPC ...................................... 345/100; 377/64–81
See application file for complete search history.

(56) References Cited

U.S. PATENT DOCUMENTS

| | | | |
|---|---|---|---|
| 2005/0220263 A1* | 10/2005 | Moon | 377/68 |
| 2008/0055225 A1 | 3/2008 | Pak et al. | |
| 2009/0256794 A1* | 10/2009 | Jang et al. | 345/100 |
| 2010/0110047 A1 | 5/2010 | Yoon et al. | |
| 2010/0177082 A1 | 7/2010 | Joo et al. | |
| 2010/0277206 A1* | 11/2010 | Lee et al. | 327/108 |
| 2011/0267326 A1* | 11/2011 | Kim et al. | 345/211 |

FOREIGN PATENT DOCUMENTS

| | | |
|---|---|---|
| KR | 10 2008-0020876 A | 3/2008 |
| KR | 10 2010-0048100 A | 5/2010 |
| KR | 10 2010-0083370 A | 7/2010 |
| KR | 10 2010-0119119 A | 11/2010 |

* cited by examiner

*Primary Examiner* — Chanh Nguyen
*Assistant Examiner* — Jonathan Blancha
(74) *Attorney, Agent, or Firm* — Lee & Morse, P.C.

(57) ABSTRACT

A gate driver includes stages coupled to each other and outputting gate signals. Each stage includes a node driver, a pull-up unit, a node controller, a first node stabilizer, and a pull-down unit. The node driver outputs a first voltage or a second voltage to a first node in response to a first or a second input signal. The pull-up unit pulls an output terminal to high in response to a voltage of the first node. The node controller outputs an on-voltage to a second node in response to a first clock signal from a third node or a second clock signal from a fourth node. The first node stabilizer stabilizes the first node to an off-voltage in response to a voltage of the second node. The pull-down unit pulls the output terminal to low in response to the voltage of the second node or the second input signal.

21 Claims, 9 Drawing Sheets

GATE DRIVER WITH NODE STABILIZER AND DISPLAY DEVICE INCLUDING THE SAME

CROSS REFERENCE TO RELATED APPLICATION

This application claims priority under 35 U.S.C. §119 to Korean patent Application No. 2011-0075555 filed on Jul. 29, 2011, the disclosure of which is hereby incorporated by reference herein in its entirety.

BACKGROUND

1. Technical Field

Example embodiments of the inventive concept relate to display devices. More particularly, example embodiments of the inventive concept relate to gate drivers driving gate lines of display panels and display devices including the gate drivers.

2. Description of the Related Art

A liquid crystal display (LCD) device includes a display panel in which a liquid crystal layer having anisotropic permittivity is formed between two substrates, and a driving unit that drives the display panel. To display an image, the LCD device generates an electric field between the two substrates, and adjusts light transmittance of the liquid crystal layer by adjusting the intensity of the electric field. The display panel includes a plurality of pixels arranged in a matrix form. The pixels are coupled to a plurality of gate lines and a plurality of data lines. The pixels display an image in response to gate signals applied through the gate lines and data signals applied through the data lines.

SUMMARY

Example embodiments provide gate drivers ensuring high reliability of gate signals.

Example embodiments provide display devices including the gate drivers.

According to one aspect of example embodiments, there is provided a gate driver including a plurality of stages configured to output a plurality of gate signals, the plurality of stages being coupled to each other. Each stage includes a node driving unit, a pull-up unit, a node controlling unit, a first node stabilizing unit and a pull-down unit. The node driving unit outputs a first voltage or a second voltage to a first node in response to a first input signal or a second input signal. The pull-up unit pulls up an output terminal to a logic high level in response to a voltage of the first node. The node controlling unit outputs an on-voltage to a second node in response to a first clock signal received from a third node or a second clock signal received from a fourth node. The first node stabilizing unit stabilizes the first node to an off-voltage in response to a voltage of the second node. The pull-down unit pulls down the output terminal to a logic low level in response to the voltage of the second node or the second input signal.

In example embodiments, the node driving unit may include a first node driving block configured to output the first voltage to the first node in response to the first input signal, and a second node driving block configured to output the second voltage to the first node in response to the second input signal.

In example embodiments, the node controlling unit may include a first node controlling block configured to output the on-voltage to the second node in response to a voltage of the third node, and a second node controlling block configured to output the on-voltage to the second node in response to a voltage of the fourth node.

In example embodiments, the pull-up unit may include a pull-up transistor including a source electrode receiving the first clock signal, a drain electrode coupled to the output terminal, and a gate electrode coupled to the first node. The pull-up transistor may output the first clock signal to the output terminal in response to the voltage of the first node.

In example embodiments, the pull-up unit may further include a capacitor coupled between the gate electrode of the pull-up transistor and the drain electrode of the pull-up transistor.

In example embodiments, each stage may further include a second node stabilizing unit configured to stabilize the second node to the off-voltage in response to the voltage of the first node.

In example embodiments, each stage may further include a third node stabilizing unit configured to stabilize the third node to the off-voltage in response to the voltage of the first node, and a fourth node stabilizing unit configured to stabilize the fourth node to the off-voltage in response to a voltage of the third node or the voltage of the first node.

In example embodiments, the fourth node stabilizing unit may include a first stabilizing block configured to stabilize the fourth node to the off-voltage in response to the voltage of the first node, and a second stabilizing block configured to stabilize the fourth node to the off-voltage in response to the voltage of the third node.

In example embodiments, each stage may further include a capacitor unit configured to boost the voltage of the first node.

In example embodiments, the capacitor unit may include a capacitor coupled to the first node, a first control block configured to apply the off-voltage to the capacitor in response to the voltage of the second node, and a second control block configured to apply the first clock signal to the capacitor in response to the voltage of the first node.

In example embodiments, the capacitor may include a first electrode coupled to the first node, and a second electrode coupled to the first control block and the second control block.

In example embodiments, the first node may be stabilized to the off-voltage while the second clock signal has the logic high level.

In example embodiments, the first node may be stabilized to the off-voltage before the first clock signal transitions from the logic low level to the logic high level.

In example embodiments, the first input signal of a current stage may be an output signal of a previous stage, and the second input signal of the current stage may be an output signal of a next stage.

In example embodiments, the first input signal of a current stage may be an output signal of a stage before a previous stage, and the second input signal of the current stage may be an output signal of a stage after a next stage.

According to another aspect of example embodiments, there is provided a display device including a display panel, a data driver and a gate driver. The display panel includes gate lines, data lines crossing the gate lines, and a plurality of pixels. The data driver outputs a plurality of data signals to the data lines. The gate driver includes a plurality of stages configured to output a plurality of gate signals to the plurality of gate lines, respectively. Each stage includes a node driving unit configured to output a first voltage or a second voltage to a first node in response to a first input signal or a second input signal, a pull-up unit configured to pull up an output terminal to a logic high level in response to a voltage of the first node, a node controlling unit configured to output an on-voltage to a second node in response to a first clock signal received from a third node or a second clock signal received from a fourth node, a first node stabilizing unit configured to stabilize the first node to an off-voltage in response to a voltage of the second node, and a pull-down unit configured to pull down the output terminal to a logic low level in response to the voltage of the second node or the second input signal.

In example embodiments, the node controlling unit may include a first node controlling block configured to output the on-voltage to the second node in response to a voltage of the third node, and a second node controlling block configured to output the on-voltage to the second node in response to a voltage of the fourth node.

In example embodiments, each stage may further include a second node stabilizing unit configured to stabilize the second node to the off-voltage in response to the voltage of the first node.

In example embodiments, each stage may further include a third node stabilizing unit configured to stabilize the third node to the off-voltage in response to the voltage of the first node, and a fourth node stabilizing unit configured to stabilize the fourth node to the off-voltage in response to a voltage of the third node or the voltage of the first node; and In example embodiments, each stage may further include a capacitor unit configured to boost the voltage of the first node.

In example embodiments, the capacitor unit may include a capacitor coupled to the first node, a first control block configured to apply the off-voltage to the capacitor in response to the voltage of the second node, and a second control block configured to apply the first clock signal to the capacitor in response to the voltage of the first node.

In example embodiments, the first node may be stabilized to the off-voltage while the second clock signal has the logic high level.

In example embodiments, the first node may be stabilized to the off-voltage before the first clock signal transitions from the logic low level to the logic high level.

According to example embodiments, the gate driver and the display device may efficiently reduce noise included in gate signals that are output through a plurality of gate lines, and may efficiently improve reliability of the gate signals. Further, the gate driver and the display device according to example embodiments may efficiently reduce a leakage current that may occur in the gate driver.

BRIEF DESCRIPTION OF THE DRAWINGS

Example embodiments can be understood in more detail from the following description taken in conjunction with the accompanying drawings, in which.

DETAILED DESCRIPTION

Figure 1:
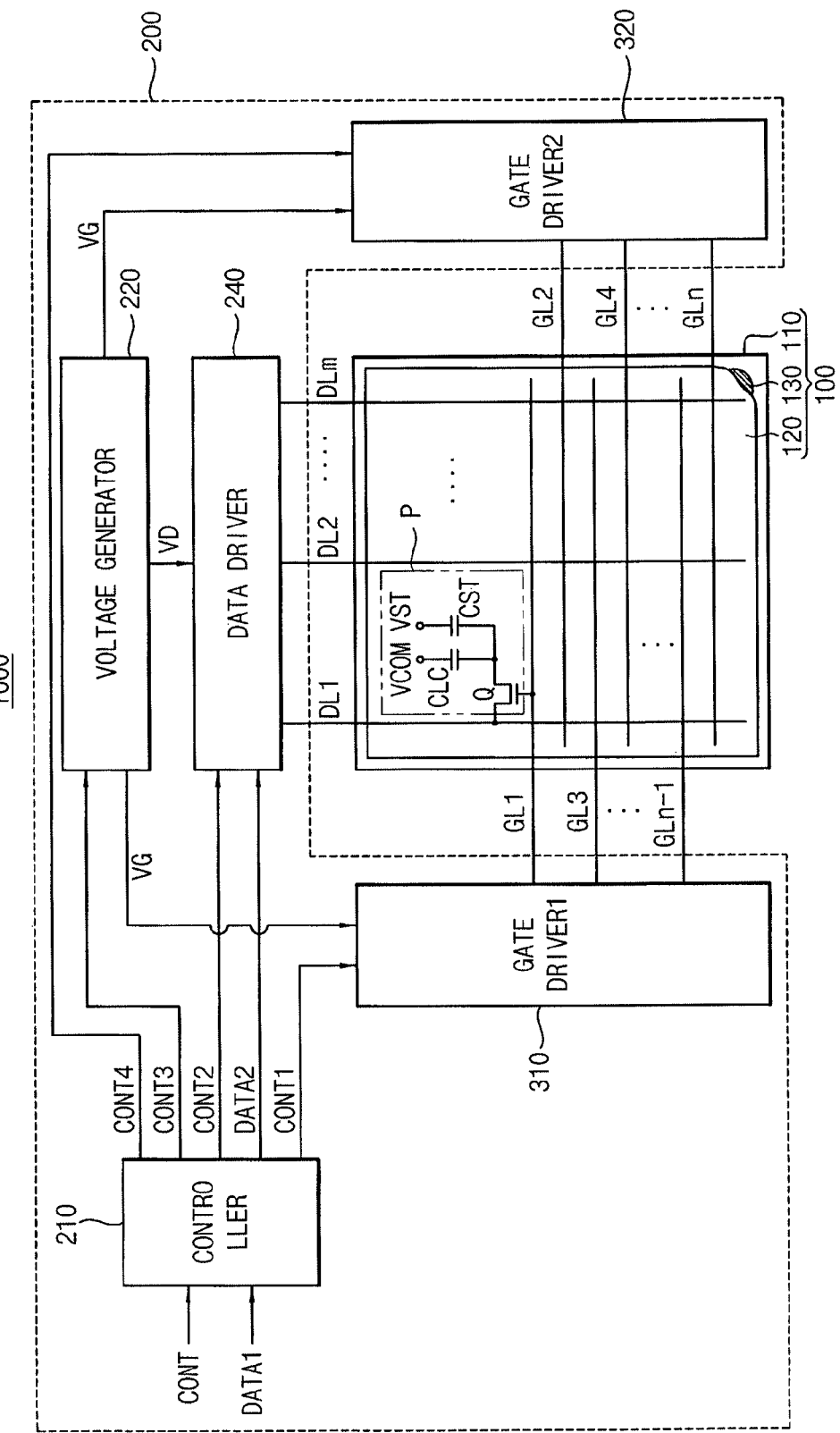
FIG. 1 is a block diagram illustrating a display device in accordance with example embodiments.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
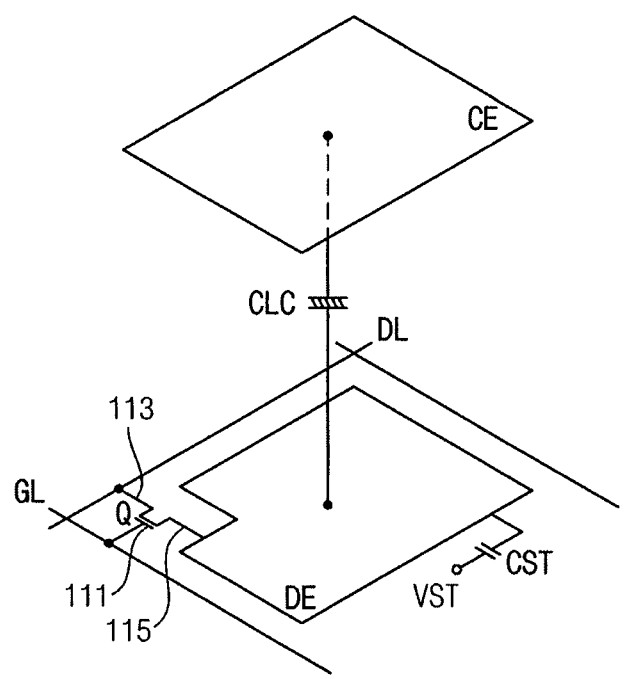
FIG. 2 is a diagram illustrating a pixel included in a liquid crystal display panel illustrated in FIG. 1.

FIG. 1 is a block diagram illustrating a display device in accordance with example embodiments. FIG. 2 is a diagram illustrating a pixel included in a liquid crystal display panel illustrated in FIG. 1.

Referring to FIGS. 1 and 2, a display device 1000 includes a display panel 100 and a driving unit 200 for driving the display panel 100.

The display panel 100 includes a plurality of gate lines GL1, GL2, GL3, GL4, GLn−1, and GLn extending in a first direction, a plurality of data lines DL1, DL2, and DLm extending in a second direction crossing the first direction, and a plurality of pixels P coupled to the plurality of gate lines GL1, GL2, GL3, GL4, GLn−1, and GLn and the plurality of data lines DL1, DL2, and DLm. The plurality of pixels P may be arranged in a matrix form. Each pixel P may include a switching element Q coupled to a corresponding gate line GL and a corresponding data line DL, a liquid crystal capacitor CLC, and a storage capacitor CST coupled to the switching element Q.

The display panel 100 may include a lower substrate 110 on which the plurality of gate lines GL1, GL2, GL3, GL4, GLn−1, and GLn, the plurality of data lines DL1, DL2, and DLm, switching elements Q, and pixel electrodes DE are formed, an upper substrate 120 on which common electrodes CE are formed, and a liquid crystal layer 130 disposed between the lower substrate 110 and the upper substrate 120.

The lower substrate 110 may include the pixel electrodes DE formed in regions where the plurality of gate lines GL1, GL2, GL3, GL4, GLn−1 and GLn cross the plurality of data lines DL1, DL2, and DLm. The upper substrate 120 may include the common electrodes CE opposed to the pixel electrodes DE of the lower substrate 110. The common electrodes CE may be in parallel with the plurality of gate lines GL1, GL2, GL3, GL4, GLn−1, and GLn, and may be spaced apart from each other. For example, one common electrode CE may be opposed to one row of the pixel electrodes DE corresponding to one gate line GL.

Each pixel P includes the switching element Q and the pixel electrode DE. The switching element Q may be a thin film transistor (TFT) including a gate electrode 111 coupled to a gate line GL, a source electrode 113 coupled to a data line DL, and a drain electrode 115 coupled to the pixel electrode DE and the storage capacitor CST.

The switching element Q may be formed on the lower substrate 110. The switching element Q may provide the liquid crystal capacitor CLC with a data signal of the data line DL in response to a gate signal of the gate line GL. The switching element Q may be coupled to the gate line GL through the gate electrode 111, may be coupled to the data line DL through the source electrode 113, and may be coupled to the liquid crystal capacitor CLC through the drain electrode 115 and the pixel electrode DE. The liquid crystal capacitor CLC may be charged to a voltage difference between the data signal applied to the pixel electrode DE and a common voltage (VCOM) applied to the common electrode CE, and light transmittance of the liquid crystal layer 130 may be adjusted based on the charged voltage in the liquid crystal capacitor CLC. For example, in a case of a normally black mode, the light transmittance of the liquid crystal layer 130 may increase as the charged voltage (or the voltage difference between the data signal and the common voltage) increases, and may decrease as the charged voltage decreases.

The pixel electrode DE formed on the lower substrate 110 may serve as a first electrode of the liquid crystal capacitor CLC, the common electrode CE formed on the upper substrate 120 may serve as a second electrode of the liquid crystal capacitor CLC, and the liquid crystal layer 310 disposed between the pixel electrode DE and the common electrode CE may serve as a dielectric of the liquid crystal capacitor CLC. Thus, the liquid crystal capacitor CLC may have a predetermined capacitance. The pixel electrode DE may be provided with the data signal through the data line DL, and the common electrode CE may be provided with the common voltage through a signal line (not shown) formed on the lower substrate 110. In some example embodiments, the common voltage may have a low voltage level when the data signal has a positive polarity and may have a high voltage level when the data signal has a negative polarity. In this case, the charged voltage of the liquid crystal capacitor CLC may be higher than the data signal applied through the data line DL. Thus, power consumption may be reduced.

The storage capacitor CST may allow the liquid crystal capacitor CLC to retain the charged voltage. The storage capacitor CST may be formed such that a signal line (not shown) formed on the lower substrate 110 overlaps the pixel electrode DE and a dielectric is disposed between the signal line and the pixel electrode DE. In some example embodiments, the pixel P may not include the storage capacitor CST. Although not illustrated, according to example embodiments, a color filter (not shown) may be formed on the upper substrate 120, and polarizing plates may be attached to the lower substrate 110 and the upper substrate 120.

Referring again to FIG. 1, the driving unit 200 may include a controller 210, a voltage generator 220, a first gate driver 310, a second gate driver 320, and a data driver 240.

The controller 210 may receive an input control signal CONT and an input image signal DATA1 from an image source (not shown), such as an external graphics device. The input control signal CONT may include a main clock signal, a vertical synchronization signal (VSYNC), a horizontal synchronization signal (HSYNC) and a data enable signal. The controller 210 may generate a digital data signal DATA2 based on the input image signal DATA1, and may provide the digital data signal DATA2 to the data driver 240. The controller 210 may generate a first control signal CONT1 for controlling an operation timing of the first gate driver 310, a second control signal CONT2 for controlling an operation timing of the data driver 240, a third control signal CONT3 for controlling an operation timing of the voltage generator 220, and a fourth control signal CONT4 for controlling an operation timing of the second gate driver 320 based on the input control signal CONT.

The first gate driver 310 may sequentially apply gate signals to odd-numbered gate lines GL1, GL3, and GLn−1 during each frame based on the first control signal CONT1 received from the controller 210 and a gate driving voltage VG received from the voltage generator 220. The second gate driver 320 may sequentially apply gate signals to even-numbered gate lines GL2, GL4, and GLn during each frame based on the fourth control signal CONT4 received from the controller 210 and the gate driving voltage VG received from the voltage generator 220. Although FIG. 1 illustrates an example of the display device 1000 including two gate drivers 310 and 320, in some example embodiments, the display device 1000 may include a single gate driver for sequentially driving the plurality of gate lines GL1, GL2, GL3, GL4, GLn−1, and GLn.

The data driver 240 may convert the digital data signal DATA2 received from the controller 210 into an analog data voltage based on the second control signal CONT2 received from the controller 210 and a data driving voltage VD received from the voltage generator 220. The data driver 240 may apply the data voltage to the plurality of data lines DL1, DL2, and DLm.

Hereinafter, an operation of the display panel 100 will be described below with reference to FIGS. 1 and 2.

If the gate signal is applied to a selected one of the plurality of gate lines GL1, GL2, GL3, GL4, GLn−1, and GLn, and the data voltage is applied to the plurality of data lines DL1, DL2, and DLm, switching elements Q included in pixels P coupled to the selected gate line GL may be turned on. If the switching elements Q are turned on, the data voltage may be applied to the pixel electrodes DE of the pixels P. If the data voltage and the common voltage are applied to the pixel electrodes DE and the common electrode CE, respectively, an electric field may be generated between the pixel electrodes DE and the common electrode CE, and the liquid crystal capacitors CLC included in the pixels P may be charged. Accordingly, alignment of liquid crystal molecules included in the liquid crystal layer 130 may be adjusted, and the light transmittance of the liquid crystal layer 130 may be adjusted to display an image.

Figure 3:
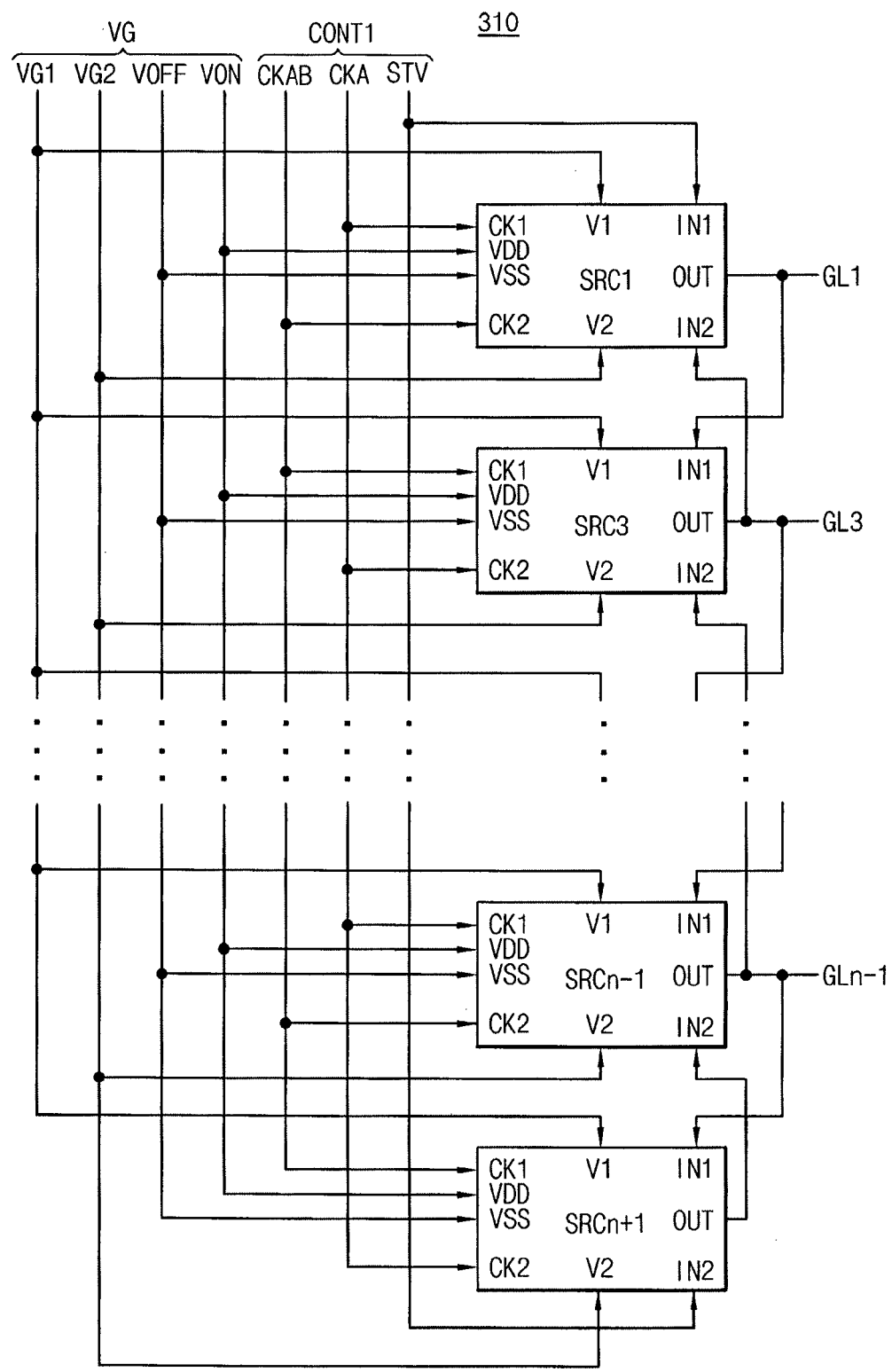
FIG. 3 is a block diagram illustrating an example of a first gate driver illustrated in FIG. 1.

FIG. 3 is a block diagram illustrating an example of a first gate driver illustrated in FIG. 1.

Referring to FIG. 3, the first gate driver 310 may include odd-numbered stages SRC1, SRC3, and SRCn−1 that are sequentially coupled to each other. In some example embodiments, the first gate driver 310 may further include a dummy stage SRCn+1 as a last stage. In other example embodiments, the first gate driver 310 may further include two or more dummy stages as last stages, to minimize noise that may occur during a porch period before a vertical start signal STV is input to each stage.

Each stage SRC1, SRC3, SRCn−1, and SRCn+1 may include a first clock terminal CK1, a second clock terminal CK2, a first input terminal IN1, a second input terminal IN2, an on-voltage terminal VDD, an off-voltage terminal VSS, a first voltage terminal V1, a second voltage terminal V2, and an output terminal OUT.

First and second clock signals CKA and CKAB having opposite phases may be provided to the first and second clock terminals CK1 and CK2. For example, the first clock signal CKA may be provided to the first clock terminal CK1 of (4M−3)-th stages SRC1, and SRCn−1, and the second clock signal CKAB may be provided to the second clock terminal CK2 of the (4M−3)-th stages SRC1 and SRCn−1, where M is an integer greater than 0. The second clock signal CKAB may be provided to the first clock terminal CK1 of (4M−1)-th stages SRC3 and SRCn+1, and the first clock signal CKA may be provided to the second clock terminal CK2 of the (4M−1)-th stages SRC3 and SRCn+1. The (4M−3)-th stages SRC1 and SRCn−1 and the (4M−1)-th stages SRC3 and SRCn+1 may alternately and sequentially operate in response to the first and second clock signals CKA and CKAB having opposite phases. For example, a period of the first clock signal CKA and the second clock signal CKAB may be about double a horizontal period of a display panel.

The vertical start signal STV or a gate signal of a previous stage (or an output signal of the previous stage) may be provided to the first input terminal IN1. For example, the vertical start signal STV may be provided to the first input terminal IN1 of a first stage SRC1, and the gate signal of the previous stage (e.g., the first stage SRC1) may be provided to the first input terminal IN1 of a current stage (e.g., a third stage SRC3).

A gate signal of a next stage (or an output signal of the next stage) or the vertical start signal STV may be provided to the second input terminal IN2. For example, the gate signal of the next stage (e.g., the third stage SRC3) may be provided to the second input terminal IN2 of a current stage (e.g., the first stage SRC1), and the vertical start signal STV may be provided to the second input terminal IN2 of a last stage (e.g., an (n+1)-th stage SRCn+1).

An on-voltage VON may be provided to the on-voltage terminal VDD and an off-voltage VOFF may be provided to the off-voltage terminal VSS. A first voltage VG1 may be provided to the first voltage terminal V1 and a second voltage VG2 may be provided to the second voltage terminal V2. The first and second voltages VG1 and VG2 may be gate-on voltages. The first voltage VG1 and the second voltage VG2 may have different voltage levels. For example, the first voltage VG1 may have a logic high level (e.g., a voltage level of the on-voltage VON) and the second voltage VG2 may have a logic low level (e.g., a voltage level of the off-voltage VOFF).

The first gate driver 310 may receive the first clock signal CKA, the second clock signal CKAB, and the vertical start signal STV as a first control signal CONT1 from the controller 210. The first gate driver 310 may receive the on-voltage VON, the off-voltage VOFF, the first voltage VG1, and the second voltage VG2 as a gate driving voltage VG from the controller 210.

The gate signals may be output to gate lines GL1, GL3, and GLn−1 at the output terminals OUT of the odd-numbered stages SRC1, SRC3, and SRCn−1. For example, one of the gate signals at the output terminals OUT of the (4M−3)-th stages SRC1 and SRCn−1 may be output during each high level period of the first clock signal CKA, and one of the gate signals at the output terminal OUT of one of the (4M−1)-th stages SRC3 may be output during each high level period of the second clock signal CKAB. Thus, the gate signals may be sequentially output from the output terminals OUT of the odd-numbered stages SRC1, SRC3, and SRCn−1.

Figure 4:
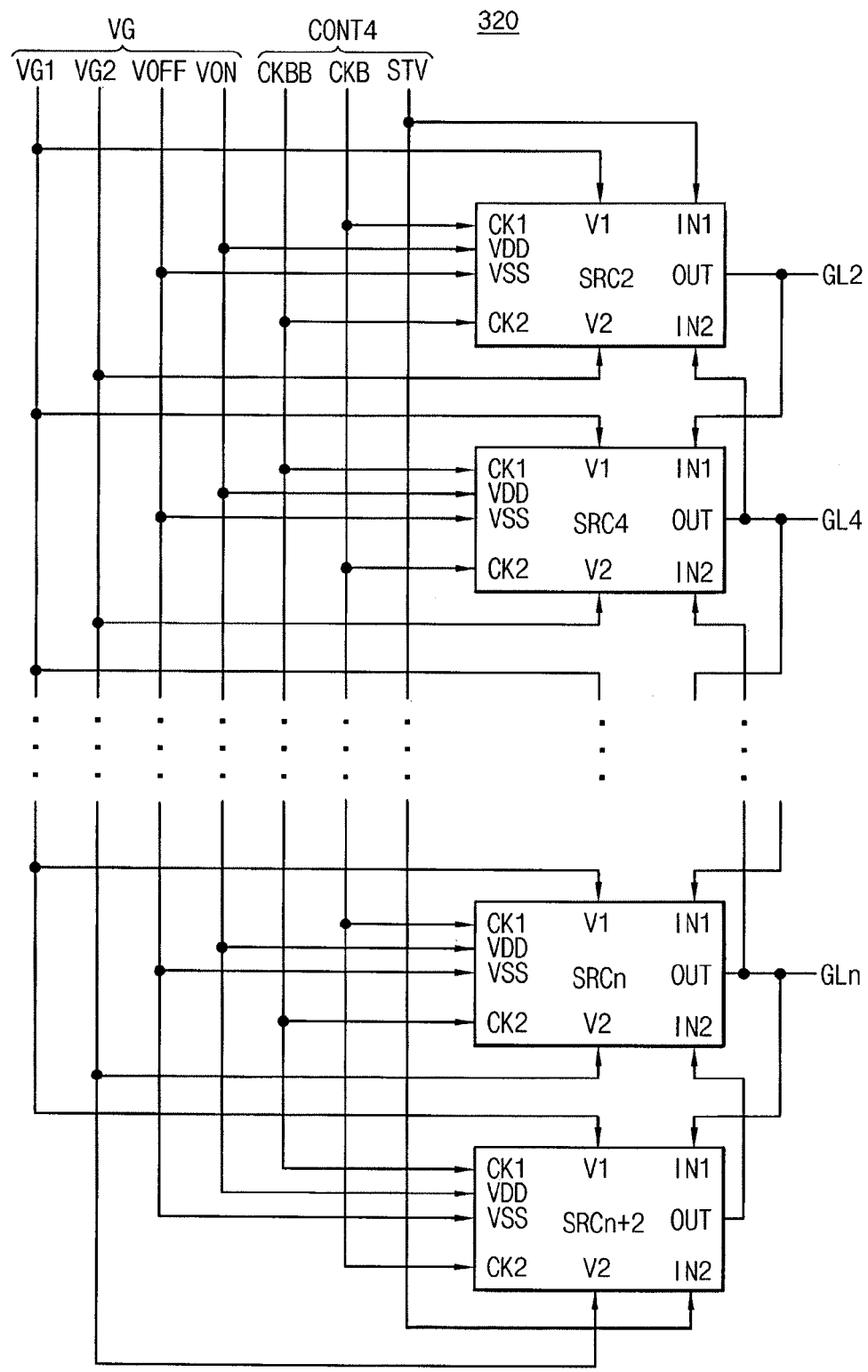
FIG. 4 is a block diagram illustrating an example of a second gate driver illustrated in FIG. 1.

FIG. 4 is a block diagram illustrating an example of a second gate driver illustrated in FIG. 1.

Referring to FIG. 4, the second gate driver 320 may include even-numbered stages SRC2, SRC4, and SRCn that are sequentially coupled to each other. In some example embodiments, the second gate driver 320 may further include a dummy stage SRCn+2 as a last stage. In other example embodiments, the second gate driver 320 may further include two or more dummy stages as last stages, to minimize noise that may occur during a porch period before a vertical start signal STV is input to each stage.

Each stage SRC2, SRC4, SRCn, and SRCn+2 may include a first clock terminal CK1, a second clock terminal CK2, a first input terminal IN1, a second input terminal IN2, an on-voltage terminal VDD, an off-voltage terminal VSS, a first voltage terminal V1, a second voltage terminal V2, and an output terminal OUT.

Third and fourth clock signals CKB and CKBB having opposite phases may be provided to the first and second clock terminals CK1 and CK2. For example, the third clock signal CKB may be provided to the first clock terminal CK1 of (4M−2)-th stages SRC2 and SRCn, and the fourth clock signal CKBB may be provided to the second clock terminal CK2 of the (4M−2)-th stages SRC2 and SRCn, where M is an integer greater than 0. The fourth clock signal CKBB may be provided to the first clock terminal CK1 of (4M)-th stages SRC4 and SRCn+2, and the third clock signal CKB may be provided to the second clock terminal CK2 of the (4M)-th stages SRC4 and SRCn+2. The (4M−2)-th stages SRC2 and SRCn and the (4M)-th stages SRC4 and SRCn+2 may alternately and sequentially operate in response to the third and fourth clock signals CKB and CKBB having opposite phases. For example, a period of the third clock signal CKB and the fourth clock signal CKBB may be about double a horizontal period of a display panel. Further, the third clock signal CKB may be delayed by the horizontal period with respect to a first clock signal CKA illustrated in FIG. 3.

The vertical start signal STV or a gate signal of a previous stage (or an output signal of the previous stage) may be provided to the first input terminal IN1. For example, the vertical start signal STV may be provided to the first input terminal IN1 of a second stage SRC2, and the gate signal of the previous stage (e.g., the second stage SRC2) may be provided to the first input terminal IN1 of a current stage (e.g., a fourth stage SRC4).

A gate signal of a next stage (or an output signal of the next stage) or the vertical start signal STV may be provided to the second input terminal IN2. For example, the gate signal of the next stage (e.g., the fourth stage SRC4) may be provided to the second input terminal IN2 of a current stage (e.g., the second stage SRC2), and the vertical start signal STV may be provided to the second input terminal IN2 of a last stage (e.g., an (n+2)-th stage SRCn+2).

An on-voltage VON may be provided to the on-voltage terminal VDD, and an off-voltage VOFF may be provided to the off-voltage terminal VSS. A first voltage VG1 may be provided to the first voltage terminal V1 and a second voltage VG2 may be provided to the second voltage terminal V2. The first and second voltages VG1 and VG2 may be gate-on voltages. The first voltage VG1 and the second voltage VG2 may have different voltage levels. For example, the first voltage VG1 may have a logic high level (e.g., a voltage level of the on-voltage VON), and the second voltage VG2 may have a logic low level (e.g., a voltage level of the off-voltage VOFF).

The second gate driver 320 may receive the third clock signal CKB, the fourth clock signal CKBB, and the vertical start signal STV as a fourth control signal CONT4 from the controller 210. The second gate driver 320 may receive the on-voltage VON, the off-voltage VOFF, the first voltage VG1, and the second voltage VG2 as a gate driving voltage VG from the controller 210.

The gate signals may be output to gate lines GL2, GL4, and GLn at the output terminals OUT of the even-numbered stages SRC2, SRC4, and SRCn. For example, one of the gate signals at the output terminals OUT of the (4M−2)-th stages SRC2 and SRCn may be output during each high level period of the third clock signal CKB, and one of the gate signals at the output terminal OUTs of the (4M)-th stages SRC4 may be output during each high level period of the fourth clock signal CKBB. Thus, the gate signals may be sequentially output from the output terminals OUT of the even-numbered stages SRC2, SRC4, and SRCn.

Figure 5:
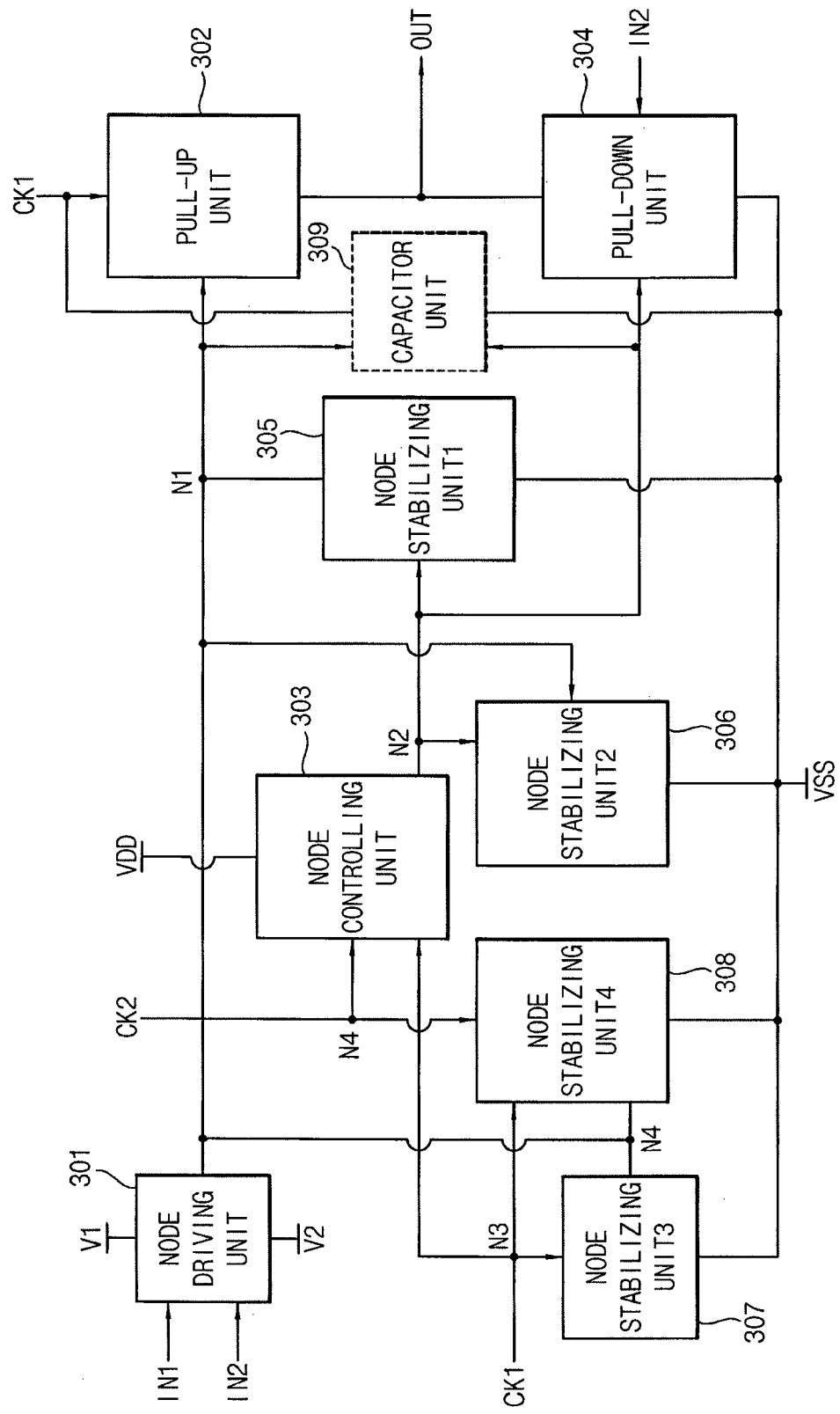
FIG. 5 is a block diagram illustrating a stage included in a gate driver in accordance with example embodiments.

FIG. 5 is a block diagram illustrating a stage included in a gate driver in accordance with example embodiments.

Referring to FIG. 5, each stage included in the first gate driver 310 of FIG. 3 or the second gate driver of FIG. 4 may includes node driving unit 301, a pull-up unit 302, a node controlling unit 303, a first node stabilizing unit 305, a pull-down unit 304, a second node stabilizing unit 306, a third node stabilizing unit 307, and a fourth node stabilizing unit 308. In some example embodiments, each stage may further include a capacitor unit 309 that boosts a voltage of a first node N1 for controlling the pull-up unit 302. Hereinafter, a signal received from a first input terminal may be referred to as a first input signal IN1, a signal received from a second input terminal may be referred to as a second input signal IN2, a voltage received from an on-voltage terminal may be referred to as an on-voltage VON, a voltage received from an off-voltage terminal may be referred to as an off-voltage VOFF, a signal received from a first clock terminal may be referred to as a first clock signal CK1, and a signal received from a second clock terminal may be referred to as a second clock signal CK2.

The node driving unit 301 may drive the first node N1 to a first voltage VG1 or a second voltage VG2 in response to the first input signal IN1 and the second input signal IN2. For example, the node driving unit 301 may output the first voltage VG1 to the first node N1 in response to the first input signal IN1 and may output the second voltage VG2 to the first node N1 in response to the second input signal IN2. As described above, the first input signal IN1 may be an output signal (or a gate signal) of a previous stage and the second input signal IN2 may be an output signal (or a gate signal) of a next stage. The node driving unit 301 may control the voltage of the first node N1 to turn on the pull-up unit 302 during a high level period of the first input signal IN1 and to turn off the pull-up unit 302 during a high level period of the second input signal IN2.

The pull-up unit 302 may pull up an output terminal OUT to a logic high level in response to the voltage of the first node N1. For example, the pull-up unit 302 may output the first clock signal CK1 to the output terminal OUT in response to the voltage of the first node N1. Thus, the pull-up unit 302 may output an output signal (or a gate signal) having the logic high level at the output terminal OUT.

The node controlling unit 303 may output the on-voltage VON to a second node N2 in response to the first clock signal CK1 received from a third node N3 or the second clock signal CK2 received from a fourth node N4. By outputting the on-voltage VON to the second node N2, the node controlling unit 303 may control the first node stabilizing unit 305 to stabilize the first node N1 to the off-voltage VOFF such that the first node N1 may not be in a floating state.

The first node stabilizing unit 305 may stabilize the first node N1 to the off-voltage VOFF in response to the voltage of the second node N2. For example, while the node driving unit 301 outputs neither the first voltage VG1 nor the second voltage VG2, the first node stabilizing unit 305 may stabilize the first node N1 to the off-voltage VOFF to prevent the first node N1 from being in the floating state.

The pull-down unit 304 may pull down the output terminal OUT to a logic low level in response to the voltage of the second node N2 or the second input signal IN2. For example, if the voltage of the second node N2 has a logic high level (e.g., a voltage level of the on-voltage VON), or if the second input signal IN2 has the logic high level, the pull-down unit 304 may output the off-voltage VOFF to the output terminal OUT. Thus, the pull-down unit 304 may output an output signal (or a gate signal) having the logic low level at the output terminal OUT.

The second node stabilizing unit 306 may stabilize the second node N2 to the off-voltage VOFF in response to the voltage of the first node N1. The third node stabilizing unit 307 may stabilize the third node N3 to the off-voltage VOFF in response to the voltage of the first node N1. The fourth node stabilizing unit 308 may stabilize the fourth node N4 to the off-voltage VOFF in response to a voltage of the third node N3 or the voltage of the first node N1. For example, the fourth node stabilizing unit 308 may output the off-voltage VOFF to the fourth node N4 in response to the voltage of the third node N3, and may output the off-voltage VOFF to the fourth node N4 in response to the voltage of the first node N1.

In a conventional gate driver, the first node N1 for controlling the pull-up unit 302 may be in a floating state while the second clock signal CK2 has a logic high level. Thus, noise may be caused by the coupling at the first node N1 when the first clock signal CK1 transitions from a logic low level to a logic high level, and a gate signal may be unintentionally output at the output terminal OUT. Further, since the voltage of the first node N1 in the floating state may temporarily increase when the first clock signal CK1 transitions from a logic low level to a logic high level, a leakage current may occur while the first node N1 is stabilized from the temporarily increased voltage to the off-voltage VOFF.

In the gate driver according to example embodiments, each stage may stabilize the first node N1 to the off-voltage VOFF while the second clock signal CK2 has the logic high level (e.g., the voltage level of the on-voltage VON). For example, each stage may stabilize the first node N1 while the first input signal IN1 has the logic low level and the first clock signal CK1 has the logic low level (or a voltage level of the off-voltage VOFF). Thus, when the first clock signal CK1 transitions from the logic low level to the logic high level, the first node N1 may not be in the floating state, and may be maintained to the off-voltage VOFF.

As described above, each stage included in the gate driver according to example embodiments may stabilize the first node N1 that is a control node of the pull-up unit 302 based on the first clock signal CK1 and the second clock signal CK2. Accordingly, noise caused by the coupling at the first node N1 may be reduced. Further, since the first node N1 is maintained to the off-voltage VOFF while the first clock signal CK1 transitions from the logic low level to the logic high level, the leakage current may be reduced. Therefore, each stage included in the gate driver according to example embodiments may improve reliability of a gate signal output from the output terminal OUT by reducing the noise at the first node N1, and may reduce power consumption by reducing the leakage current.

Figure 6:
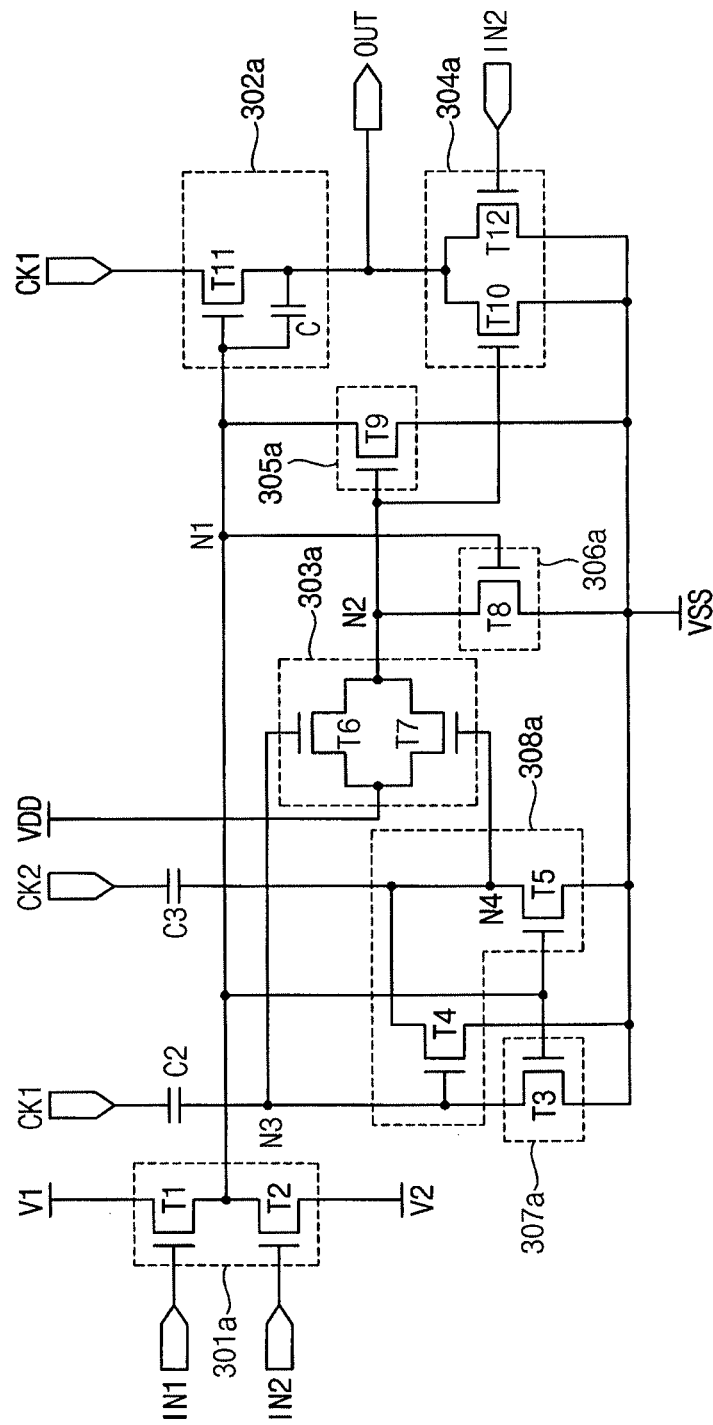
FIG. 6 is a circuit diagram illustrating an example of a stage of FIG. 5.

FIG. 6 is a circuit diagram illustrating an example of a stage of FIG. 5.

Referring to FIG. 6, each stage included in the first gate driver 310 of FIG. 3 or the second gate driver 320 of FIG. 4 may include a node driving unit 301a, a pull-up unit 302a, a node controlling unit 303a, a first node stabilizing unit 305a, a pull-down unit 304a, a second node stabilizing unit 306a, a third node stabilizing unit 307a, and a fourth node stabilizing unit 308a.

The pull-up unit 302a may pull up an output terminal OUT to a logic high level in response to a voltage of a first node N1. For example, the pull-up unit 302a may output a first clock signal CK1 to the output terminal OUT in response to the voltage of the first node N1. The pull-up unit 302a may include a first transistor T11. The first transistor T11 may include an input electrode receiving the first clock signal CK1, an output electrode coupled to the output terminal OUT, and a control electrode coupled to the first node N1. Here, the control electrode, the input electrode, and the output electrode of each transistor may correspond to a gate electrode, a source electrode, and a drain electrode of the transistor, respectively.

The pull-up unit 302a may further include a first capacitor C formed between the control electrode and the output electrode of the first transistor T11. The first capacitor C may store the voltage of the first node N1 to turn on the first transistor T11.

The node driving unit 301a may include a first node driving block and a second node driving block. The first node driving block may output a first voltage VG1 in response to a first input signal IN1. The first node driving block may include a second transistor T1. An input electrode of the second transistor T1 may be coupled to a first voltage terminal V1 to receive the first voltage VG1. A control electrode of the second transistor T1 may be coupled to a first input terminal to receive the first input signal IN1. An output electrode of the second transistor T1 may be coupled to the first node N1, and may be coupled to the control electrode of the first transistor T11 included in the pull-up unit 302a through the first node N1. The second node driving block may output a second voltage VG1 in response to a second input signal IN2. The second node driving block may include a third transistor T2. An input electrode of the third transistor T2 may be coupled to a second voltage terminal V2 to receive the second voltage VG2. A control electrode of the third transistor T2 may be coupled to a second input terminal to receive the second input signal IN2. An output electrode of the third transistor T2 may be coupled to the first node N1, and may be coupled to the control electrode of the first transistor T11 included in the pull-up unit 302a through the first node N1.

The second transistor T1 may be turned on in response to the first input signal IN1 (or an output signal of a previous stage) having a logic high level. If the second transistor T1 is turned on, the first voltage VG1 may be output to the first node N1 to charge the first capacitor C. If the first capacitor C is charged to a voltage higher than a threshold voltage of the first transistor T11, and the first clock signal CK1 transitions from a logic low level to a logic high level, the first transistor T1 may be turned on to output the first clock signal CK1 having the logic high level to the output terminal OUT.

The third transistor T2 may be turned on in response to the second input signal IN2 (or an output signal of a next stage) having a logic high level. If the third transistor T2 is turned on, the first capacitor C may be discharged to an off-voltage VOFF. Thus, the first node N1 may have a logic low level, and the first transistor T11 may be turned off not to output the first clock signal CK1.

The pull-down unit 304a may pull down the output terminal OUT to a logic low level in response to a voltage of a second node N2 or the second input signal IN2. For example, if the voltage of the second node N2 has a logic high level, or if the second input signal IN2 has a logic high level, the pull-down unit 304a may output the off-voltage VOFF to the output terminal OUT. The pull-down unit 304a may include a first pull-down block and a second pull-down block. The first pull-down block may pull down the output terminal OUT to the off-voltage VOFF in response the voltage of the second node N2. The first pull-down block may include a fourth transistor T10. The fourth transistor T10 may include a control electrode coupled to the second node N2, an input electrode coupled to an off-voltage terminal VSS to receive the off-voltage VOFF, and an output electrode coupled to the output terminal OUT. The second pull-down block may pull down the output terminal OUT to the off-voltage VOFF in response the second input signal IN2. The second pull-down block may include a fifth transistor T12. The fifth transistor T12 may include a control electrode coupled to the second input terminal to receive the second input signal IN2, an input electrode coupled to the off-voltage terminal VSS to receive the off-voltage VOFF, and an output electrode coupled to the output terminal OUT.

The node controlling unit 303a may output an on-voltage VON to the second node N2 in response to the first clock signal CK1 received from a third node N3 or the second clock signal CK2 received from a fourth node N4. The node controlling unit 303a may include a first node controlling block and a second node controlling block. The first node controlling block may output the on-voltage VON to the second node N2 in response to a voltage of the third node N3, and the second node controlling block may output the on-voltage VON to the second node N2 in response to a voltage of the fourth node N4. The third node N3 may be coupled to a first clock terminal to which the first clock signal CK1 is applied and the fourth node N4 may be coupled to a second clock terminal to which the second clock signal CK2 is applied. In some example embodiments, a second capacitor C2 may be coupled between the third node N3 and the first clock terminal, and a third capacitor C3 may be coupled between the fourth node N4 and the second clock terminal.

The first node controlling block may include a sixth transistor T6. A control electrode of the sixth transistor T6 may be coupled to the third node N3 to receive the first clock signal CK1 charged in the second capacitor C2. An input electrode of the sixth transistor T6 may be coupled to an on-voltage terminal VDD to receive the on-voltage VON. An output electrode of the sixth transistor T6 may be coupled to the second node N2. The second node controlling block may include a seventh transistor T7. A control electrode of the seventh transistor T7 may be coupled to the fourth node N4 to receive the second clock signal CK2 charged in the third capacitor C3. An input electrode of the seventh transistor T7 may be coupled to the on-voltage terminal VDD to receive the on-voltage VON. An output electrode of the seventh transistor T7 may be coupled to the second node N2.

The first node stabilizing unit 305a may stabilize the first node N1 to the off-voltage VOFF in response to the voltage of the second node N2. For example, while the node driving unit 301a outputs neither the first voltage VG1 nor the second voltage VG2, the first node stabilizing unit 305 may stabilize the first node N1 to the off-voltage VOFF to prevent the first node N1 from being in a floating state. The first node stabilizing unit 305a may include an eighth transistor T9 including a control electrode coupled to the second node N2, an input electrode coupled to the off-voltage terminal VSS, and an output electrode coupled to the first node N1.

The second node stabilizing unit 306a may stabilize the second node N2 to the off-voltage VOFF in response to the voltage of the first node N1. The second node stabilizing unit 306a may include a ninth transistor T8 including a control electrode coupled to the first node N1, an input electrode coupled to the off-voltage terminal VSS, and an output electrode coupled to the second node N2.

The third node stabilizing unit 307a may stabilize the third node N3 to the off-voltage VOFF in response to the voltage of the first node N1. The third node stabilizing unit 307a may include a tenth transistor T3 including a control electrode coupled to the first node N1, an input electrode coupled to the off-voltage terminal VSS, and an output electrode coupled to the third node N3.

The fourth node stabilizing unit 308a may stabilize the fourth node N4 to the off-voltage VOFF in response to a voltage of the third node N3 or the voltage of the first node N1. The fourth node stabilizing unit 308a may include a first stabilizing block and a second stabilizing block. The first stabilizing block may stabilize the fourth node N4 to the off-voltage VOFF in response to the voltage of the first node N1. The first stabilizing block may include an eleventh transistor T5 including a control electrode coupled to the first node N1, an input electrode coupled to the off-voltage terminal VSS, and an output electrode coupled to the fourth node N4. The second stabilizing block may stabilize the fourth node N4 to the off-voltage VOFF in response to the voltage of the third node N3. The second stabilizing block may include a twelfth transistor T4 including a control electrode coupled to the third node N3, an input electrode coupled to the off-voltage terminal VSS, and an output electrode coupled to the fourth node N4.

In the gate driver according to example embodiments, each stage may stabilize the first node N1 to the off-voltage VOFF while the second clock signal CK2 has the logic high level (e.g., a voltage level of the on-voltage VON). For example, each stage may stabilize the first node N1 to the off-voltage VOFF while the first input signal IN1 has the logic low level and the first clock signal CK1 has the logic low level (or a voltage level of the off-voltage VOFF). Thus, when the first clock signal CK1 transitions from the logic low level to the logic high level, the first node N1 may not be in the floating state, and may be maintained to the off-voltage VOFF.

As described above, each stage included in the gate driver according to example embodiments may stabilize the first node N1 based on the first clock signal CK1 and the second clock signal CK2. Accordingly, noise caused by the coupling at the first node N1 may be reduced. Further, since the first node N1 is maintained to the off-voltage VOFF while the first clock signal CK1 transitions from the logic low level to the logic high level, the leakage current may be reduced. Therefore, each stage included in the gate driver according to example embodiments may improve reliability of a gate signal output from the output terminal OUT by reducing the noise at the first node N1, and may reduce power consumption by reducing a leakage current.

Figure 7:
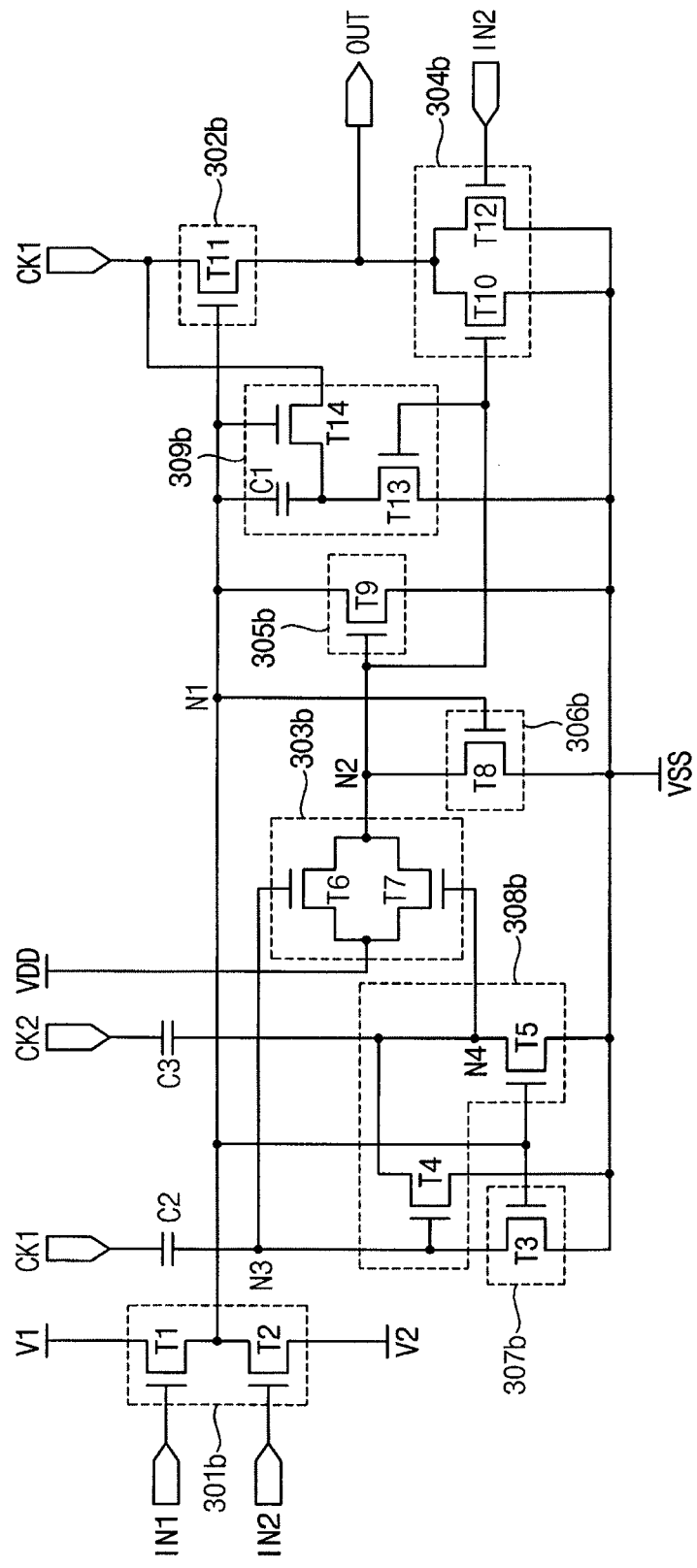
FIG. 7 is a circuit diagram illustrating an example of a stage of FIG. 5.

FIG. 7 is a circuit diagram illustrating an example of a stage of FIG. 5.

Referring to FIG. 7, each stage included in the first gate driver 310 of FIG. 3 or the second gate driver 320 of FIG. 4 may include a node driving unit 301b, a pull-up unit 302b, a node controlling unit 303b, a first node stabilizing unit 305b, a pull-down unit 304b, a second node stabilizing unit 306b, a third node stabilizing unit 307b, a fourth node stabilizing unit 308b, and a capacitor unit 309b.

Compared to a stage of FIG. 6, the stage of FIG. 7 may further include the capacitor unit 309b instead of the first capacitor C of the pull-up unit 302a illustrated in FIG. 6. Therefore, detailed descriptions of elements of the stage of FIG. 6 substantially the same as or substantially similar to those of the stage of FIG. 7 will be omitted or simplified.

The capacitor unit 309b may include a fourth capacitor C1, a first control block and a second control block. The first control block may apply an off-voltage VOFF to the fourth capacitor C1 in response to a voltage of the second node N2. The first control block may include a thirteenth transistor T13 having a control electrode coupled to the second node N2, an input electrode coupled to the off-terminal VSS, and an output electrode coupled to the fourth capacitor C1. The second control block may apply the first clock signal CK1 to the fourth capacitor C1 in response to a voltage of a first node N1. The second control block may include a fourteenth transistor T14 having a control electrode connected to the first node N1, an input electrode coupled to the first clock signal CK1, and an output electrode coupled to the fourth capacitor C1. The fourth capacitor C1 may include a first electrode coupled to the first node N1, and a second electrode coupled to the first control block and the second control block.

Figure 8:
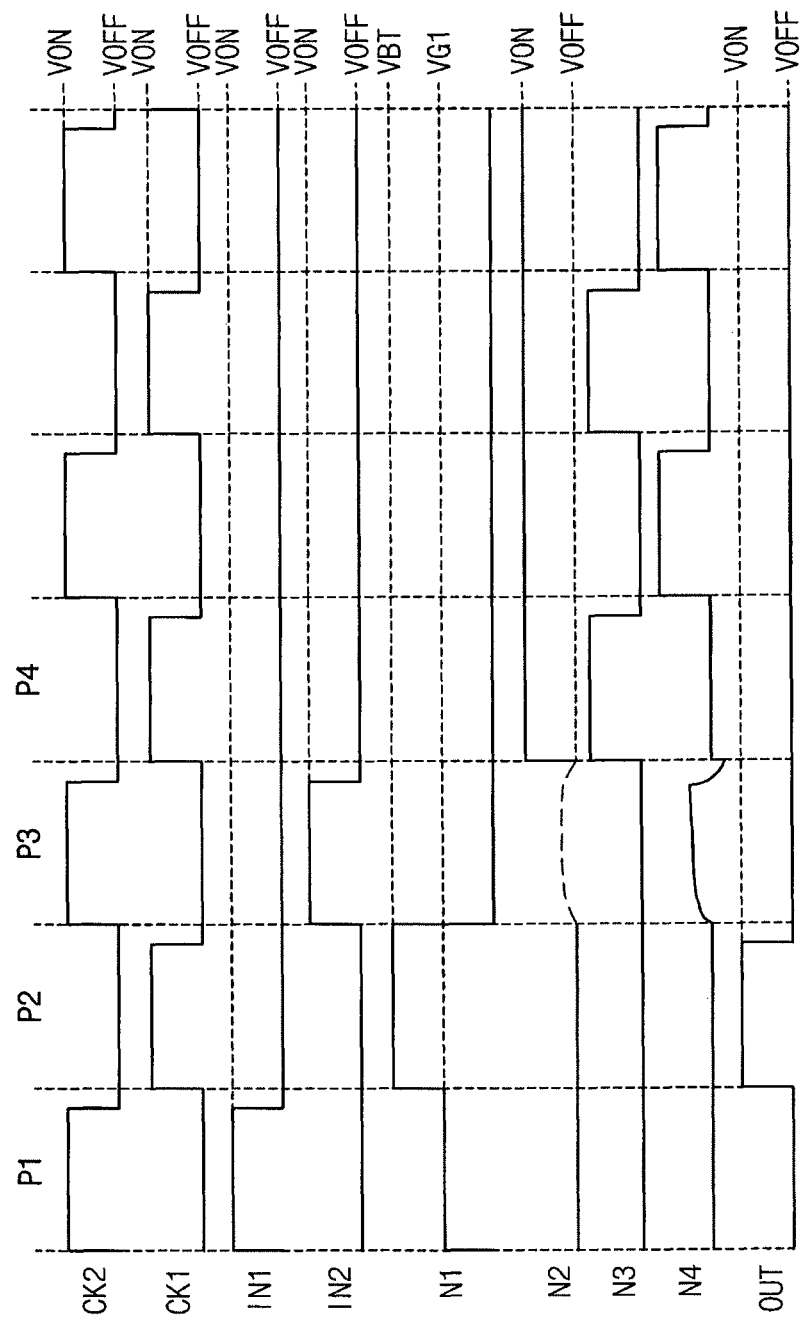
FIG. 8 is a timing diagram for describing an operation of a gate driver in accordance with example embodiments.

FIG. 8 is a timing diagram for describing an operation of a gate driver in accordance with example embodiments. FIG. 8 illustrates an example where the logic high level and the logic low level are the voltage level of the on-voltage VON and the voltage level of the off-voltage VOFF, respectively, but are not limited thereto. Further, a voltage drop by a turned-on transistor in FIGS. 6 and 7 may not be considered in FIG. 8.

Referring to FIG. 8, the on-voltage VON may be applied as the first voltage VG1 to the first voltage terminal V1, and the off-voltage VOFF may be applied as the second voltage VG2 to the second voltage terminal V2. The first clock signal CK1 may be applied to the first clock terminal, and the second clock signal CK2 may be applied to the second clock terminal. In some example embodiments, duty ratios of the first and second clock signals CK1 and CK2 may be less than about 50%, a rising edge of the first clock signal CK1 may be delayed by a predetermined time with respect to a falling edge of the second clock signal CK2, and a rising edge of the second clock signal CK2 may be delayed by a predetermined time with respect to a falling edge of the first clock signal CK1. In other example embodiments, the duty ratios of the first and second clock signals CK1 and CK2 may be equal to or greater than about 50%.

During a first period P1, each stage may receive the first input signal IN1 having the logic high level (or the voltage level of the on-voltage VON). The node driving unit 301 may output the first voltage VG1 (or the on-voltage VON) to the first node N1 in response to the first input signal IN1 having the logic high level. The second node stabilizing unit 306 may stabilize the second node N2 to the off-voltage VOFF in response to the voltage of the first node N1 having the logic high level. The third node stabilizing unit 307 may stabilize the third node N3 to the off-voltage VOFF in response to the voltage of the first node N1 having the logic high level. The fourth node stabilizing unit 308 may stabilize the fourth node N4 to the off-voltage VOFF in response to the voltage of the first node N1 having the logic high level. Since the first clock signal CK1 has the logic low level (or the voltage level of the off-voltage VOFF), the pull-up unit 301 may output the first clock signal CK1 having the logic low level to the output terminal OUT.

During a second period P2, each stage may receive the first input signal IN1 having the logic low level and the second input signal IN2 having the logic low level. Thus, the first node N1 may be electrically decoupled from the first and second input signals IN1 and IN2, and may be boosted to a boost voltage higher than the first voltage VG1 by the first capacitor C illustrated in FIG. 6 or the fourth capacitor C1 illustrated in FIG. 7 coupled to the first node N1. The pull-up unit 302 may output the first clock signal CK1 having the logic high level to the output terminal OUT. The second through fourth node stabilizing units 306, 307, and 308 may stabilize the second through fourth nodes N2, N3, and N4 to the off-voltage VOFF in response to the boost voltage of the boosted first node N1, respectively.

During a third period P3, each stage may receive the first input signal N1 having the logic low voltage and the second input signal IN2 having the logic high voltage. Thus, the node driving unit 301 may output the second voltage VG2 (or the off-voltage VON) to the first node N1 in response to the second input signal IN2 having the logic high level. Since the first node N1 has the logic low level, the tenth transistor T3 of the third node stabilizing unit 307 may be turned off, and, as in the second period P2, the third node N3 may be maintained to the logic low level in the third period P3. The pull-down unit 304 may pull down the output terminal OUT to the off-voltage VOFF in response to the second input signal IN2 having the logic high level.

During a fourth period P4, the first clock signal CK1 transitions from the logic low level to the logic high level. Thus, the voltage of the third node N3 may increase to the logic high level. The node controlling unit 303 may output the on-voltage VON having the logic high level to the second node N2 in response to the voltage of the third node N3 having the logic high level. The first node stabilizing unit 305 may stabilize the first node N1 to the off-voltage VOFF in response to the voltage of the second node N2 having the logic high level. The pull-down unit 304 may pull down the fourth node N4 to the logic low level in response to the voltage of the third node N3 having the logic high level. The fourth node stabilizing unit 308 may stabilize the fourth node N4 to the off-voltage VOFF in response to the voltage of the third node N3 having the logic high level. Thus, the voltage of the fourth node N4 may normally increase to the logic high level when the second clock signal CK2 transitions from the logic low level to the logic high level after the fourth period P4.

During the next period, the second clock signal CK2 transitions from the logic low level to the logic high level. Thus, the voltage of the fourth node N4 may increase to the logic high level. The node controlling unit 303 may output the on-voltage VON having the logic high level to the second node N2 in response to the voltage of the fourth node N4 having the logic high level. The first node stabilizing unit 305 may stabilize the first node N1 to the off-voltage VOFF in response to the voltage of the second node N2 having the logic high level. The pull-down unit 304 may pull down the output terminal OUT to the off-voltage VOFF in response to the voltage of the second node N2 having the logic high level. During subsequent periods, the third node N3 and the fourth node N4 may alternately and periodically have the logic high level and the logic low level. The node controlling unit 303 may maintain the second node N2 to the logic high level during a predetermined time in response to the voltage of the third and fourth nodes N3 and N4 having periodic logic levels. Thus, the first node stabilizing unit 305 may stabilize the first node N1 to the off-voltage VOFF during the predetermined time in response to the voltage of the second node N2 having the logic high level. During the predetermined time, the first node N1 may not be in the floating state, and the output terminal OUT may be maintained to the off-voltage VOFF by the pull-down unit 304.

As described above, each stage included in the gate driver according to example embodiments may stabilize the first node N1 coupled to the pull-up unit 302 that outputs the gate signal, thereby reducing noise occurring when the first node N1 is in the floating state. Further, each stage included in the gate driver according to example embodiments may prevent the pull-up unit 302 from unintentionally outputting the gate signal by reducing the noise. In addition, each stage included in the gate driver according to example embodiments may reduce the leakage current by preventing the first node N1 from being in the floating state.

Therefore, the gate driver and the display device including the gate driver according to example embodiments may efficiently reduce the noise included in the gate signals output through the plurality of gate lines GL1 through GLN, and may efficiently improve the reliability of the gate signals. Further, the gate driver and the display device including the gate driver according to example embodiments may efficiently reduce the leakage current generated in the gate drivers 301 and 302 or in a single gate driver.

Figure 9:
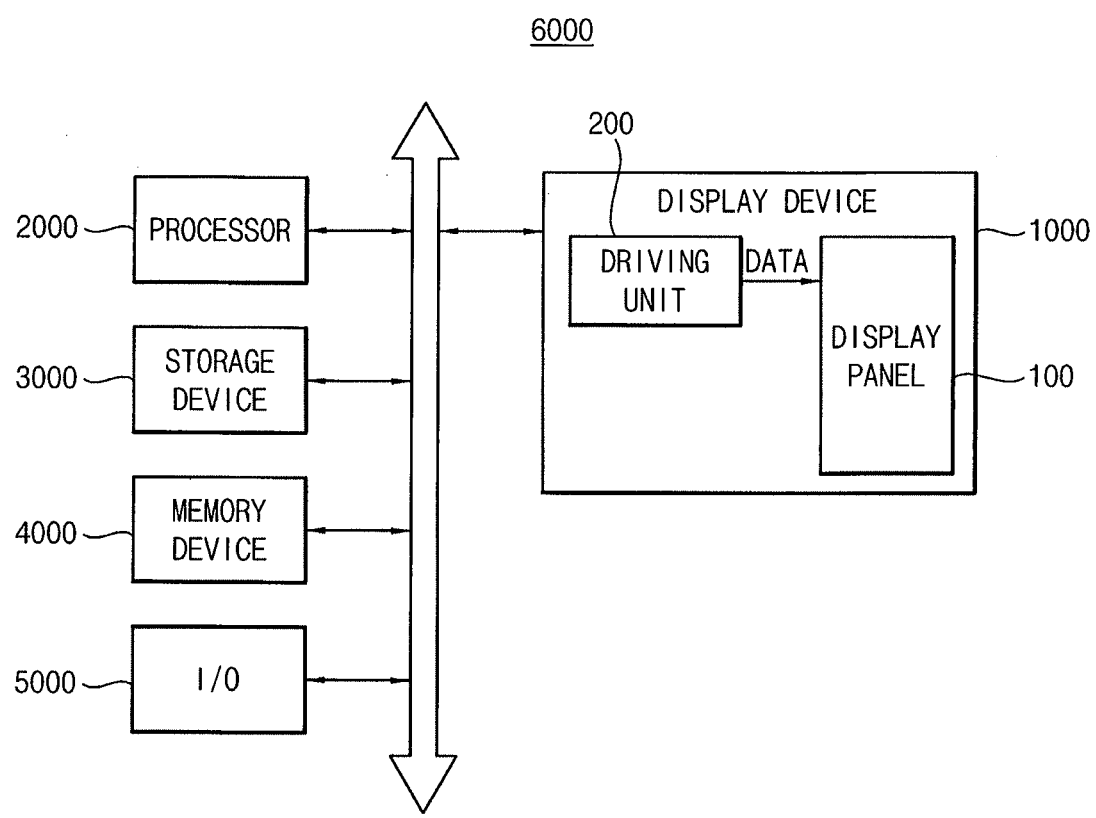
FIG. 9 is a block diagram illustrating a system in accordance with example embodiments.

FIG. 9 is a block diagram illustrating a system in accordance with example embodiments.

Referring to FIG. 9, a system 6000 includes a display device 1000, a processor 2000 and a storage device 3000.

The storage device 3000 may store image data. The storage device 3000 may include a solid state drive (SSD), a hard disk drive (HDD), a CD-ROM, etc.

The display device 1000 may display the image data. The display device 1000 may include a display panel 100 and a driving unit 200. The display panel 100 may include a plurality of pixels arranged in a matrix form. The display device 1000 may be any display device that displays an image corresponding to a data signal DATA received via the driving unit 200. For example, the display device 1000 may be an organic light emitting device (OLED), a liquid crystal display (LCD) device, a plasma display panel (PDP) device, etc.

Referring again to FIGS. 1 and 5, the driving unit 200 may include the controller 210, the voltage generator 220, the first gate driver 310, the second gate driver 320, and the data driver 240. Each of the first and second gate drivers 310 and 320 may include a plurality of stages that are sequentially coupled to each other. Each stage may include the node driving unit 301, the pull-up unit 302, the node controlling unit 303, the first node stabilizing unit 305, the pull-down unit 304, the second node stabilizing unit 306, the third node stabilizing unit 307, and the fourth node stabilizing unit 308. Each stage may stabilize the first node N1 to an off-voltage VOFF while the second clock signal CK2 has a logic low level.

Referring again to FIGS. 5 through 7, each stage may stabilize the first node N1 to the off-voltage VOFF while the first input signal IN1 has a logic low level and the first clock signal CK1 has the logic low level. Thus, each stage may maintain the first node N1 to the off-voltage VOFF when the first clock signal CK1 transitions from the logic low level to the logic high level. Each stage may stabilize the first node N1 that is a control node of the pull-up unit 302 based on the first clock signal CK1 and the second clock signal CK2. Accordingly, each stage may reduce the noise caused by the coupling at the first node N1. Further, since each stage maintains the first node N1 to the off-voltage VOFF when the first clock signal CK1 transitions from the logic low level to the logic high level, the leakage current may be reduced.

The processor 2000 may control operations of the storage device 3000 and the display device 1000. The processor 2000 may perform specific calculations and/or tasks. For example, the processor 2000 may be a microprocessor, a central process unit (CPU), a digital signal processor, or the like. The processor 2000 may communicate with the display device 1000 and the storage device 3000 via an address bus, a control bus and/or a data bus. In some example embodiments, the processor 2000 may be coupled to an extension bus, such as a peripheral component interconnect (PCI) bus.

The system 6000 may further include a memory device 4000 and an input/output device 5000. Although it is not illustrated, the system 6000 may further include various ports that communicate with a video card, a sound card, a memory card, an USB device, etc.

The memory device 4000 may store data for operating the system 6000. For example, the memory device 4000 may include a dynamic random access memory (DRAM), a mobile DRAM, a static random access memory (SRAM), a flash memory, an erasable programmable read-only memory (EPROM), an electrically erasable programmable read-only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The input/output device 5000 may include an input device, such as a keyboard, a mouse, a keypad, etc., and an output device, such as a printer, a display device, etc.

The system 6000 may be any computing system or any electronic device including the display device 1000. For example, the system 6000 may include a mobile phone, a smart phone, a personal digital assistants (PDA), a computer, a laptop computer, a tablet computer, a portable multimedia player (PMP), a digital television, a digital camera, a music player, a navigation system, etc.

As described above, the gate driver, the display device including the gate driver, and the system including the display device according to example embodiments may improve the reliability of gate signals by reducing noise of the gate driver. Further, the gate driver, the display device including the gate driver, and the system including the display device according to example embodiments may reduce the leakage current of the gate driver.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A gate driver, comprising:
   a plurality of stages to output a plurality of gate signals, the plurality of stages coupled to each other, each stage including:
   a node driver to output a first voltage or a second voltage to a first node in response to a first input signal or a second input signal;
   a pull-up circuit to pull up an output terminal to a logic high level in response to a voltage of the first node;
   a node controller to output an on-voltage to a second node in response to a first clock signal received from a third node or a second clock signal received from a fourth node;
   a first node stabilizer to stabilize the first node to an off-voltage in response to a voltage of the second node; and
   a pull-down circuit to pull down the output terminal to a logic low level in response to the voltage of the second node or the second input signal, wherein each stage includes:
   a third node stabilizer to stabilize the third node to the off-voltage in response to the voltage of the first node; and
   a fourth node stabilizer to stabilize the fourth node to the off-voltage in response to a voltage of the third node or the voltage of the first node.

2. The gate driver of claim 1, wherein the node driver comprises:
a first node driving block to output the first voltage to the first node in response to the first input signal; and
a second node driving block to output the second voltage to the first node in response to the second input signal.

3. The gate driver of claim 1, wherein the node controller comprises:
a first node controlling block to output the on-voltage to the second node in response to a voltage of the third node; and
a second node controlling block to output the on-voltage to the second node in response to a voltage of the fourth node.

4. The gate driver of claim 1, wherein the pull-up circuit comprises:
a pull-up transistor including a source electrode receiving the first clock signal, a drain electrode coupled to the output terminal, and a gate electrode coupled to the first node, the pull-up transistor to output the first clock signal to the output terminal in response to the voltage of the first node.

5. The gate driver of claim 4, wherein the pull-up circuit further comprises: a capacitor coupled between the gate electrode of the pull-up transistor and the drain electrode of the pull-up transistor.

6. The gate driver of claim 1, wherein each stage further comprises: a second node stabilizer to stabilize the second node to the off-voltage in response to the voltage of the first node.

7. The gate driver of claim 1, wherein the fourth node stabilizer comprises:
a first stabilizing block to stabilize the fourth node to the off-voltage in response to the voltage of the first node; and
a second stabilizing block to stabilize the fourth node to the off-voltage in response to the voltage of the third node.

8. The gate driver of claim 1, wherein each stage further comprises: a capacitor circuit to boost the voltage of the first node.

9. The gate driver of claim 8, wherein the capacitor circuit comprises:
a capacitor coupled to the first node;
a first control block to apply the off-voltage to the capacitor in response to the voltage of the second node; and
a second control block to apply the first clock signal to the capacitor in response to the voltage of the first node.

10. The gate driver of claim 9, wherein the capacitor comprises:
a first electrode coupled to the first node; and
a second electrode coupled to the first control block and the second control block.

11. The gate driver of claim 1, wherein the first node is stabilized to the off-voltage while the second clock signal has the logic high level.

12. The gate driver of claim 1, wherein the first node is stabilized to the off-voltage before the first clock signal transitions from the logic low level to the logic high level.

13. The gate driver of claim 1, wherein
the first input signal of a current stage is an output signal of a previous stage, and
the second input signal of the current stage is an output signal of a next stage.

14. The gate driver of claim 1, wherein
the first input signal of a current stage is an output signal of a stage before a previous stage, and
the second input signal of the current stage is an output signal of a stage after a next stage.

15. A display device, comprising:
a display panel including gate lines, data lines crossing the gate lines, and a plurality of pixels;
a data driver to output a plurality of data signals to the data lines; and
a gate driver including a plurality of stages to output a plurality of gate signals to the plurality of gate lines, respectively, each stage including:
a node driver to output a first voltage or a second voltage to a first node in response to a first input signal or a second input signal;
a pull-up circuit to pull up an output terminal to a logic high level in response to a voltage of the first node;
a node controller to output an on-voltage to a second node in response to a first clock signal received from a third node or a second clock signal received from a fourth node;
a first node stabilizer to stabilize the first node to an off-voltage in response to a voltage of the second node; and
a pull-down circuit to pull down the output terminal to a logic low level in response to the voltage of the second node or the second input signal, wherein each stage includes:
a third node stabilizer to stabilize the third node to the off-voltage in response to the voltage of the first node; and
a fourth node stabilizer to stabilize the fourth node to the off-voltage in response to a voltage of the third node or the voltage of the first node.

16. The display device of claim 15, wherein the node controller comprises:
a first node controlling block to output the on-voltage to the second node in response to a voltage of the third node; and
a second node controlling block to output the on-voltage to the second node in response to a voltage of the fourth node.

17. The display device of claim 15, wherein each stage further comprises: a second node stabilizer to stabilize the second node to the off-voltage in response to the voltage of the first node.

18. The display device of claim 15, wherein each stage further comprises: a capacitor circuit to boost the voltage of the first node.

19. The display device of claim 18, wherein the capacitor circuit comprises:
a capacitor coupled to the first node;
a first control block to apply the off-voltage to the capacitor in response to the voltage of the second node; and
a second control block to apply the first clock signal to the capacitor in response to the voltage of the first node.

20. The display device of claim 15, wherein the first node is stabilized to the off-voltage while the second clock signal has the logic high level.

21. The display device of claim 15, wherein the first node is stabilized to the off-voltage before the first clock signal transitions from the logic low level to the logic high level.

* * * * *